US012648109B2

(12) United States Patent
Chen et al.

(10) Patent No.: US 12,648,109 B2
(45) Date of Patent: Jun. 2, 2026

(54) HEAT DISSIPATION MECHANISM AND ELECTRONIC DEVICE THEREOF

(71) Applicant: Wistron Corporation, New Taipei City (TW)

(72) Inventors: Tsung-Hsien Chen, New Taipei City (TW); Chia-Cheng Su, New Taipei City (TW); Po-Yuan Hsu, New Taipei City (TW); Wan-Xuan Wang, New Taipei City (TW)

(73) Assignee: Wistron Corporation, New Taipei City (TW)

( * ) Notice: Subject to any disclaimer, the term of this patent is extended or adjusted under 35 U.S.C. 154(b) by 264 days.

(21) Appl. No.: 18/623,012

(22) Filed: Mar. 31, 2024

(65) Prior Publication Data

US 2025/0267818 A1 Aug. 21, 2025

(30) Foreign Application Priority Data

Feb. 21, 2024 (TW) .................................. 113106190

(51) Int. Cl.
*H05K 7/20* (2006.01)
(52) U.S. Cl.
CPC ................................ *H05K 7/20145* (2013.01)
(58) Field of Classification Search
CPC ....................... H05K 7/20145; H05K 7/20181
See application file for complete search history.

(56) References Cited

U.S. PATENT DOCUMENTS

| | | | |
|---|---|---|---|
| 6,896,612 B1 * | 5/2005 | Novotny ............ | H05K 7/20781 |
| | | | 361/691 |
| 2008/0089035 A1 * | 4/2008 | Ye ...................... | H05K 7/20172 |
| | | | 361/679.02 |
| 2010/0015904 A1 * | 1/2010 | Yeh ...................... | H05K 5/0214 |
| | | | 55/511 |
| 2010/0089549 A1 * | 4/2010 | Su ......................... | F04D 29/441 |
| | | | 165/80.3 |

FOREIGN PATENT DOCUMENTS

| | | | | |
|---|---|---|---|---|
| CN | 207530374 U | 6/2018 | | |
| CN | 113079593 A | * 7/2021 | ............. | H04Q 1/035 |
| CN | 116759904 A | 9/2023 | | |

OTHER PUBLICATIONS

Ye CN-113079593-A Translation (Year: 2021).*

* cited by examiner

*Primary Examiner* — Jacob R Crum
(74) *Attorney, Agent, or Firm* — Winston Hsu

(57) ABSTRACT

A heat dissipation mechanism is applied to an electronic device and includes a sheltering component, a division component, a blade, a driving component and an actuating module. The division component is disposed inside the sheltering component. The blade is pivoted to the division component. The driving component is movably disposed on the division component and connected to the blades. The actuating module is connected to the driving component. The blade is driven by the actuating module to rotate relative to the division component via the driving component.

20 Claims, 16 Drawing Sheets

HEAT DISSIPATION MECHANISM AND ELECTRONIC DEVICE THEREOF

BACKGROUND OF THE INVENTION

1. Field of the Invention

The present invention relates to a heat dissipation mechanism and an electronic device, and more particularly, to a heat dissipation mechanism of automatically adjusting ventilation efficiency in response to changes of weather and a related electronic device.

2. Description of the Prior Art

Electronic components inside the outdoor electronic device generate heat when the outdoor electronic device is operated, so that a plurality of heat dissipation holes are formed on the case of the electronic device, and a cooling fan is disposed inside the case to face the heat dissipation holes. The cooling fan extracts cold air outside the case into the electronic device through the heat dissipation holes, and then exhausts heat air inside the case out of the electronic device through the heat dissipation holes. However, if an aperture of the heat dissipation hole is small, the heat dissipation performance of the cooling fan is poor and operation of the electronic components inside the electronic device are affected; if the aperture of the heat dissipation hole is large, or exhaust volume of the cooling fan is increased, rainwater outside the case may be sucked into the electronic device by the cooling fan, which results in damage of the electronic components. Therefore, design of a heat dissipation mechanism of automatically adjusting ventilation efficiency in response to changes of weather is an important issue in the related mechanical design industry.

SUMMARY OF THE INVENTION

The present invention provides a heat dissipation mechanism of automatically adjusting ventilation efficiency in response to changes of weather and a related electronic device for solving above drawbacks.

According to the claimed invention, a heat dissipation mechanism includes a sheltering component, a division component, a blade, a driving component and an actuating module. The division component is disposed on the sheltering component. The blade is pivoted to the division component. The driving component is movably disposed on the division component and connected to the blade. The actuating module is connected to the driving component. The blade is driven by the actuating module to rotate relative to the division component via the driving component.

According to the claimed invention, the division component includes a sliding slot, the blade includes an insertion pin, the insertion pin of the blade passes through the sliding slot to connect with the driving component.

According to the claimed invention, the sheltering component includes a slot top wall and a slot bottom wall, the blade includes a middle region, a bottom region and a top region, the bottom region and the top region are respectively connected to two opposite positions of the middle region, the blade is pivoted to the division component via the middle region, the top region is located adjacent to the slot top wall than the bottom region.

According to the claimed invention, the actuating module includes a floatable element disposed on a bottom end of the driving component, the floatable element has a hollow chamber, and the driving component is pushed by a buoyancy of the floatable element, so that the bottom region of the blade is rotated relative to the slot top wall.

According to the claimed invention, the insertion pin is disposed on the top region of the blade.

According to the claimed invention, the actuating module includes a liquid storage element disposed on a bottom end of the driving component, the driving component is pulled by a weight of the liquid storage element, so that the bottom region of the blade is rotated relative to the slot bottom wall.

According to the claimed invention, the actuating module further includes a resilient component, two opposite ends of the resilient component respectively abut against the division component and the driving component, the driving component is pushed by a resilient recovering force of the resilient component, so that the bottom region of the blade is rotated relative to the slot top wall.

According to the claimed invention, the insertion pin is disposed on the bottom region of the blade.

According to the claimed invention, an electronic device includes a case and a heat dissipation mechanism. The case includes a side plate. The heat dissipation mechanism includes a sheltering component, a division component, a blade, a driving component and an actuating module. The sheltering component is connected to the side plate. The division component is disposed on the sheltering component. The blade is pivoted to the division component. The driving component is movably disposed on the division component and connected to the blade. The actuating module is connected to the driving component. The blade is driven by the actuating module to rotate relative to the division component via the driving component.

According to the claimed invention, the electronic device further includes a fan disposed inside the case and adjacent to the heat dissipation mechanism; a first heat dissipation hole is formed on the side plate of the case; the sheltering component includes an slot inner wall, a second heat dissipation hole is formed on the slot inner wall; the fan faces the second heat dissipation hole, and the second heat dissipation hole is communicated with the first heat dissipation hole.

According to the claimed invention, the sheltering component further includes a slot bottom wall, a first distance between a bottom edge of the first heat dissipation hole and the slot bottom wall is smaller than a second distance between a bottom edge of the second heat dissipation hole and the slot bottom wall.

According to the claimed invention, the case further includes a drain hole, a third distance between a bottom edge of the drain hole and the slot bottom wall is smaller than the first distance between the bottom edge of the first heat dissipation hole and the slot bottom wall.

According to the claimed invention, an electronic device includes a case, a fan and a heat dissipation mechanism. The case includes a side plate, and a first heat dissipation hole is formed on the side plate. The heat dissipation mechanism includes a sheltering component, a division component, a blade, a driving component and an actuating module. The sheltering component is connected to the side plate to form a slot body, the slot body includes an slot inner wall, and a second heat dissipation hole is formed on the slot inner wall. The division component is disposed inside the slot body of the sheltering component. The blade is pivoted to the division component. The driving component is movably disposed on the division component and connected to the blade. The actuating module is connected to the driving component. The fan faces the second heat dissipation hole, and the second heat dissipation hole faces the first heat dissipation hole, the blade is disposed between the first heat dissipation hole and the second heat dissipation hole, the blade is driven by the actuating module to rotate relative to the first heat dissipation hole and the second heat dissipation hole via the driving component.

The heat dissipation mechanism and the electronic device of the present application can rotate the blade to adjust the ventilation efficiency in response to the changes of weather. The heat dissipation mechanism of the first embodiment can set the float ball as the actuating module; the liquid can be accumulated inside the slot body in the rainy day, and the accumulated liquid can apply the buoyancy for the float ball, so the blade can be rotated to switch the heat dissipation mechanism into the waterproof mode by the actuating module and the driving component. When the rain stops, the liquid accumulated inside the slot body can be drained out of the slot body through the drain hole, the buoyancy of the float ball can be reduced, and the weight of the actuating module and the driving component can rotate the blade to switch the heat dissipation mechanism into the ventilation mode. The heat dissipation mechanism of the second embodiment can set the resilient component and the liquid storage element as the actuating module. In the rainy day, the weight of the accumulated liquid inside the liquid storage element can rotate the blade to switch the heat dissipation mechanism into the waterproof mode; when the rain stops, the accumulated liquid can flow out of the liquid storage element and the slot body, the resilient component can push and rotate the blade into the ventilation mode. Comparing to the prior art, the heat dissipation mechanism of the present application can utilize the buoyancy, the gravity and the resilient recovering force to drive rotation of the blades in response to the changes of weather, instead of utilizing any additional electronic control component to detect the weather and drive the rotation of the blades. The heat dissipation mechanism of the present application can have advantages of energy economy and simple structure, and is not easily damaged so as to avoid regular maintenance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
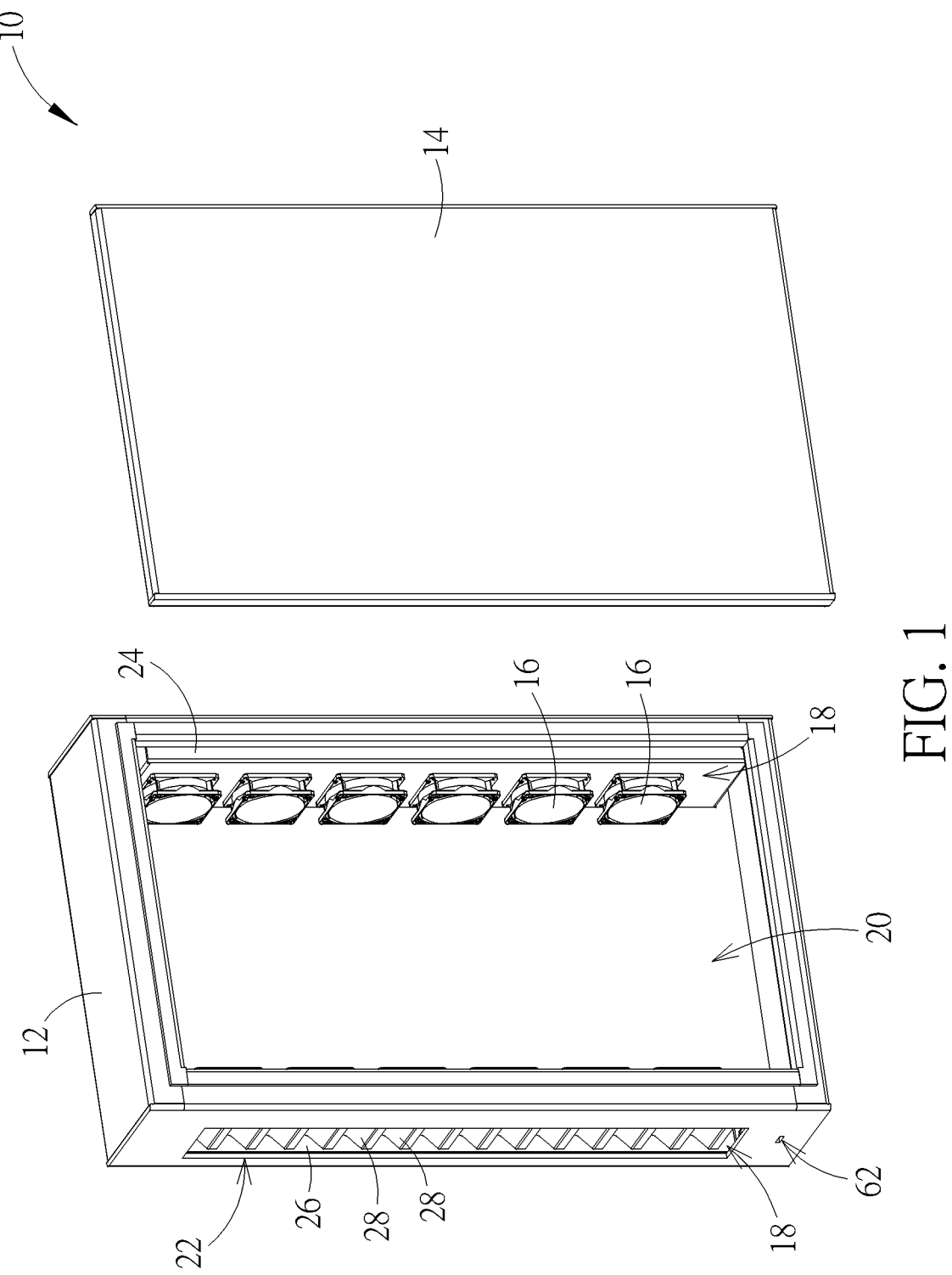
FIG. 1 is an appearance diagram of an electronic device according to a first embodiment of the present application.
Figure 2:
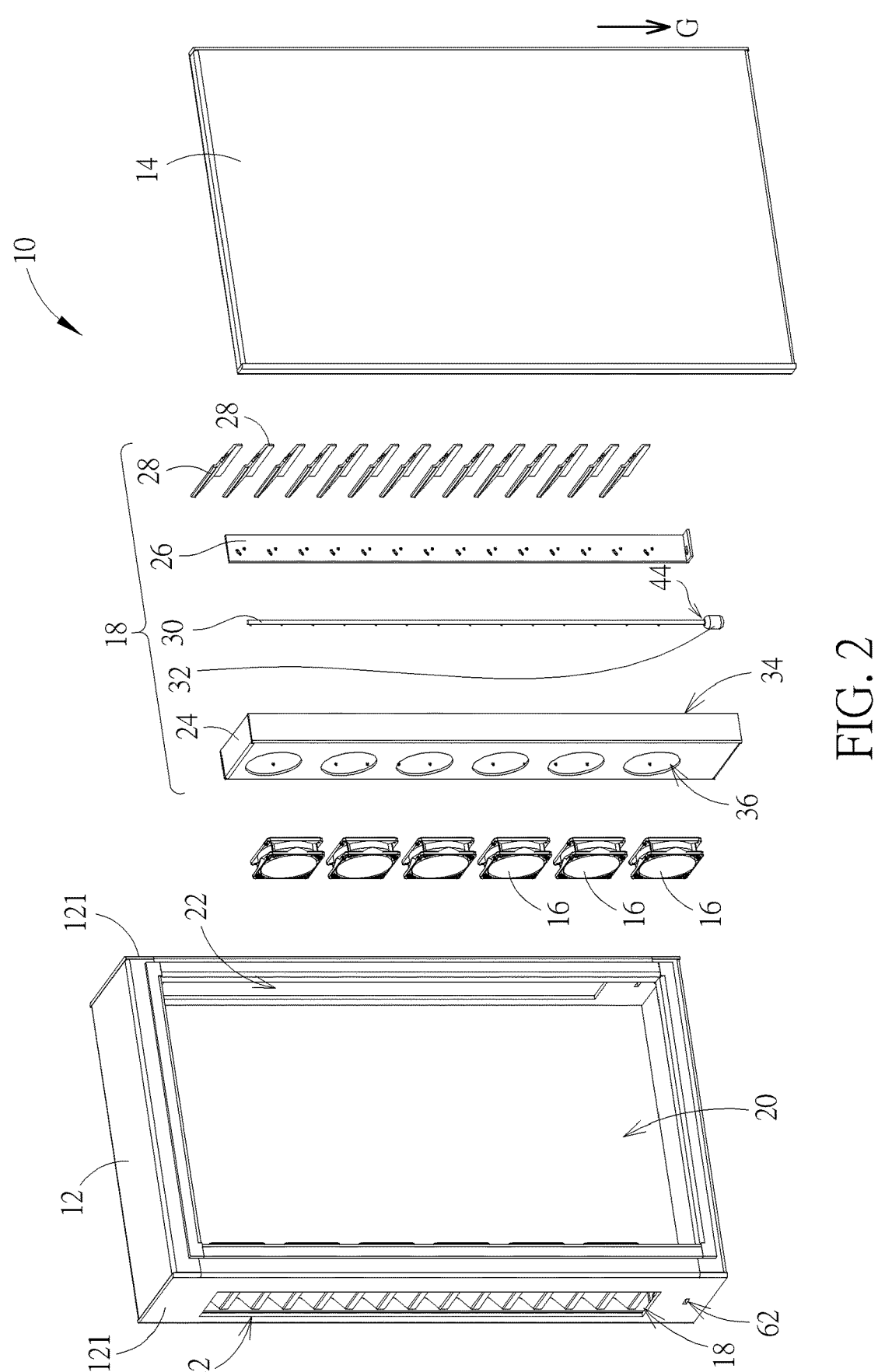
FIG. 2 is an exploded diagram of the electronic device according to the first embodiment of the present application.
Figure 3:
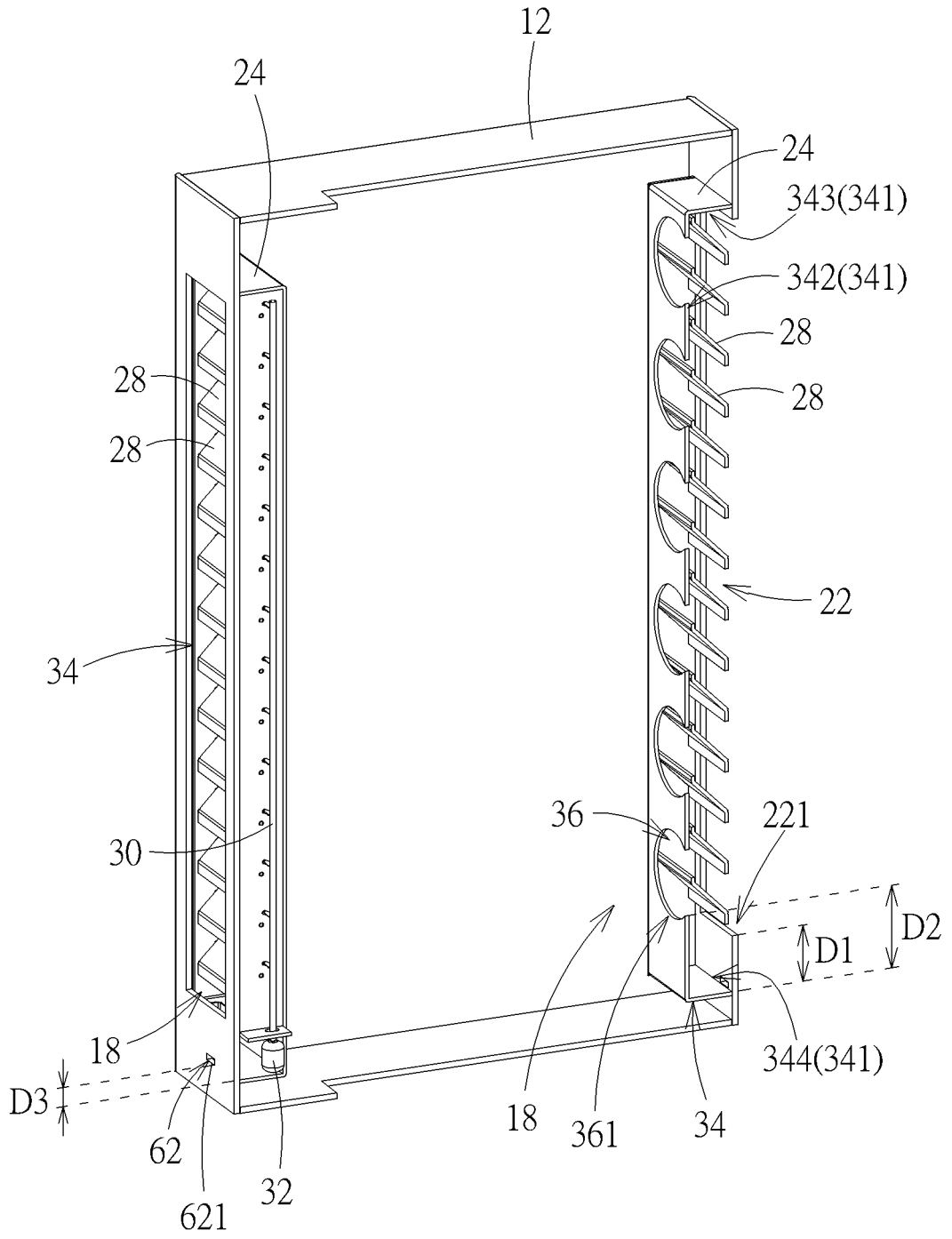
FIG. 3 is a sectional view of a part of the electronic device according to the first embodiment of the present application.

Please refer to FIG. 1 to FIG. 3. FIG. 1 is an appearance diagram of an electronic device 10 according to a first embodiment of the present application. FIG. 2 is an exploded diagram of the electronic device 10 according to the first embodiment of the present application. FIG. 3 is a sectional view of a part of the electronic device 10 according to the first embodiment of the present application. The electronic device 10 can be an outdoor charging station, an outdoor display, or an outdoor transformer box, which has a plurality of electronic components. The electronic component of the electronic device 10 can generate heat when the electronic device 10 is operated, and the electronic device 10 can automatically adjust a heat dissipation mechanism in response to changes of weather. For example, the electronic device 10 can utilize the heat dissipation mechanism to dissipate the heat in sunny days, and further can adjust the heat dissipation mechanism to avoid rainwater from flowing into the electronic device 10 and further to take into account the heat dissipating function in rain days.

The electronic device 10 can at least include a case 12, a cover 14, a fan 16 and the heat dissipation mechanism 18. Several side plates 121 of the case 12 and cover 14 are used to form an accommodating portion 20. The accommodating portion 20 can accommodate the electronic components, which are not shown in the figures. The cover 14 can cover the accommodating portion 20 to prevent dust or liquid from entering the accommodating portion 20 from external space and causing damage of the electronic components. Two opposite side plates 121 of the case 12 can respectively have a first heat dissipation hole 22. The first heat dissipation hole 22 can be a long opening formed on the side plate 121, and communicated with the external space and the accommodating portion 20 of the case 12. The fan 16 can be disposed inside the accommodating portion 20 of the case 12 and correspond to position of the first heat dissipation hole 22, so as to provide an air extraction function and an air exhaust function of the electronic device 10. A number and arrangement of the fan 16 are not limited to the embodiment shown in the figures, and depends on a design demand. The heat dissipation mechanism 18 can be disposed between the fan 16 and the first heat dissipation hole 22, and can automatically adjust its ventilation function in response to the changes of weather.

The electronic device 10 may include one heat dissipation mechanism 18 disposed adjacent to the first heat dissipation hole 22 formed on one of the side plates 121 of the case 12; further, the electronic device 10 may include two heat dissipation mechanisms 18 respectively disposed adjacent to the first heat dissipation holes 22 formed on the two opposite side plates 121 of the case 12. The heat dissipation mechanism 18 of the present application may have many variations. For example, the electronic device 10 can dispose the heat dissipation mechanism 18 with the same type or different types respectively on the two opposite side plates 121 of the case 12, which depends on the design demand.

The heat dissipation mechanism 18 can include a sheltering component 24, a division component 26, a blade 28, a driving component 30 and an actuating module 32. The sheltering component 24 can include a slot body 34, and the slot body 34 can be surrounded and formed by several slot side walls 341. The slot side walls 341 can include a slot inner wall 342 and further include a slot top wall 343 and a slot bottom wall 344 disposed along a direction of gravity G. The slot top wall 343 and the slot bottom wall 344 are respectively connected to two opposite positions of the slot inner wall 342. The slot side walls 341 can be connected to an inner wall of the side plate 121 of the case 12 facing the accommodating portion 20. The slot body 34 can accommodate the division component 26, the blade 28, the driving component 30 and the actuating module 32. In addition, a second heat dissipation hole 36 can be formed on the slot inner wall 342 of the sheltering component 24 and communicated with the first heat dissipation hole 22. A shape of the second heat dissipation hole 36 can correspond to a type of the fan 16; for example, the second heat dissipation hole 36 can be a square opening or a round opening. The shape of the second heat dissipation hole 36 can be designed as the long opening similar to the shape of the first heat dissipation hole 22. Variation of the second heat dissipation hole 36 can depend on the design demand. The division component 26 can be disposed adjacent to one of the slot side walls 341; the driving component 30 can be connected to the division component 26, and can be disposed between the division component 26 and the slot side wall 341. In some embodiments, a set of the division component 26 and the driving component 30 can be disposed on one side of the sheltering component 24, or two sets of the division component 26 and the driving component 30 can be respectively disposed on two opposite sides of the sheltering component 24. A number and position of the division component 26 and the driving component 30 can depend on the design demand.

Figure 4:
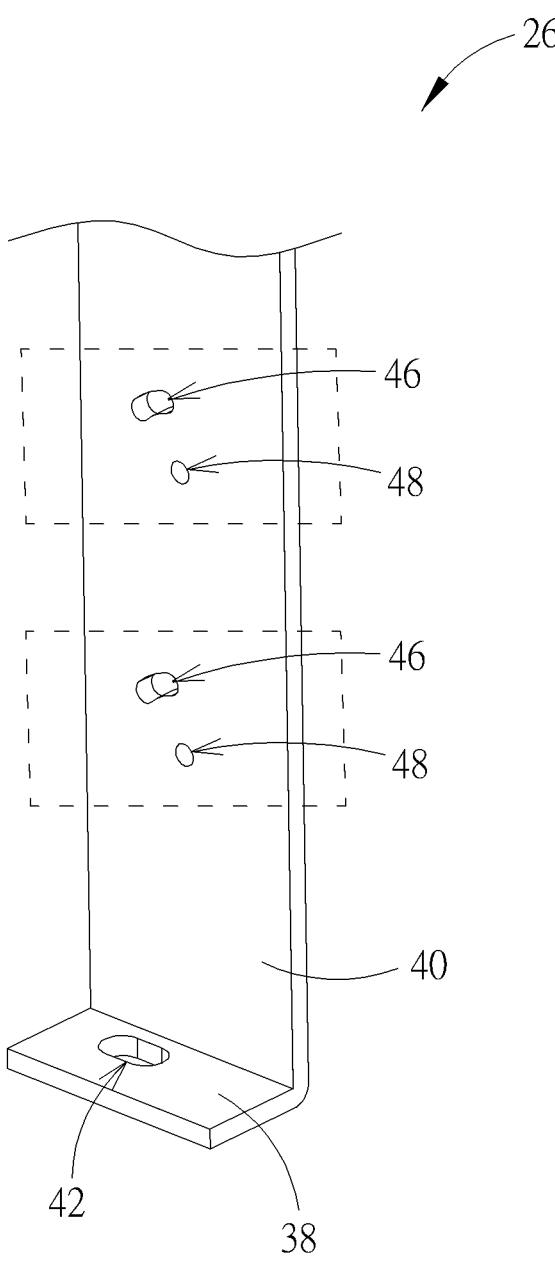
FIG. 4 is diagram of a part of a division component according to the first embodiment of the present application.
Figure 5:
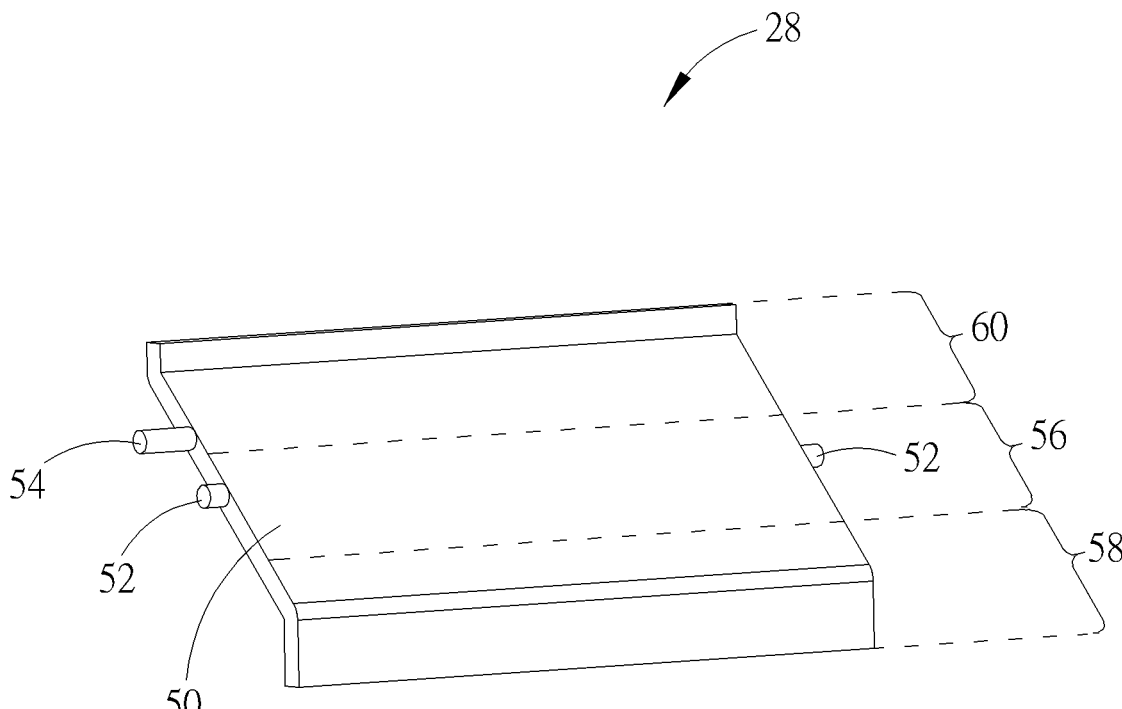
FIG. 5 is a diagram of a part of a blade according to the first embodiment of the present application.

Please refer to FIG. 1 to FIG. 5. FIG. 4 is diagram of a part of the division component 26 according to the first embodiment of the present application. FIG. 5 is a diagram of a part of the blade 28 according to the first embodiment of the present application. The division component 26 can be disposed on a side of the sheltering component 24. The division component 26 can include a first section 38 and a second section 40 bent to each other. An angle can be formed between the first section 38 and the second section 40, and the division component 26 can be the L-shaped structure. The first section 38 can include a penetration hole 42. A bottom end 44 of the driving component 30 can pass through the penetration hole 42 to connect with the actuating module 32. The second section 40 can include a plurality of sliding slots 46 and a plurality of pivot holes 48. One sliding slot 46 can be paired with one corresponding pivot hole 48 to define as pivot assembly, and the sliding slot 46 of each pivot assembly can be located above the related pivot hole 48. The blade 28 can be pivoted to the pivot hole 48. A number of the blade 28 can correspond to a number of the pivot assembly, which is not limited to the embodiment shown in the figures.

The blade 28 can include a main body 50, a shaft 52 and an insertion pin 54. The main body 50 of the blade 28 can include a middle region 56, a bottom region 58 and a top region 60. The bottom region 58 can be a region of the main body 50 that is close to and faces the actuating module 32. The bottom region 58 and the top region 60 can be respectively connected to two opposite positions of the middle region 56. The shaft 52 can be disposed on each side of the middle region 56. The middle region 56 can be pivoted to the division component 26 by inserting the shaft 52 into the pivot hole 48. The insertion pin 54 can be disposed on each side of the top region 60. The insertion pin 54 can pass through the sliding slot 46 of the division component 26 to connect with the driving component 30, and the blade 28 can be rotated through the motion of the insertion pin 54 inside the sliding slot 46, which means the insertion pin 54 can be moved inside the sliding slot 46 in accordance with the motion of the driving component 30, and the shaft 52 can be guided to rotate each blade 28 accordingly.

The bottom end 44 of the driving component 30 can pass through the penetration hole 42 to connect with the actuating module 32, so that the driving component 30 can be moved relative to the division component 26 through the penetration hole 42; a movement of the driving component 30 can be, but not limited to, upward and downward motion and leftward and rightward motion. In the first embodiment, the actuating module 32 can be a floatable element with a hollow chamber, such as a float ball, the actuating module 32 can be disposed on the bottom end 44 of the driving component 30 and adjacent to the slot bottom wall 344 of the slot body 34. The blade 28 can be driven by the actuating module 32 (such as the float ball) to rotate relative to the division component 26 via the driving component 30 in accordance with an amount of liquid accumulated in the slot body 34. A channel connected between the first heat dissipation hole 22 and the second heat dissipation hole 36 can be exposed or sheltered due to motion of the blade 28. Besides, the case 12 can further include a drain hole 62 disposed adjacent to the slot bottom wall 344 of the slot body 34 and used to drain liquid accumulated inside the slot body 34. A first distance D1 between a bottom edge 221 of the first heat dissipation hole 22 and the slot bottom wall 344 of the slot body 34 can be smaller than a second distance D2 between a side edge 361 of the second heat dissipation hole 36 and the slot bottom wall 344 of the slot body 34. A third distance D3 between a bottom edge 621 of the drain hole 62 and the slot bottom wall 344 can be smaller than the first distance D1. If rainfall is heavy and the drain hole 62 cannot drain the liquid rapidly, the liquid accumulated inside the slot body 34 can flow out through the first heat dissipation hole 22, instead of flowing into the accommodating portion 20 via the second heat dissipation hole 36.

Figure 6:
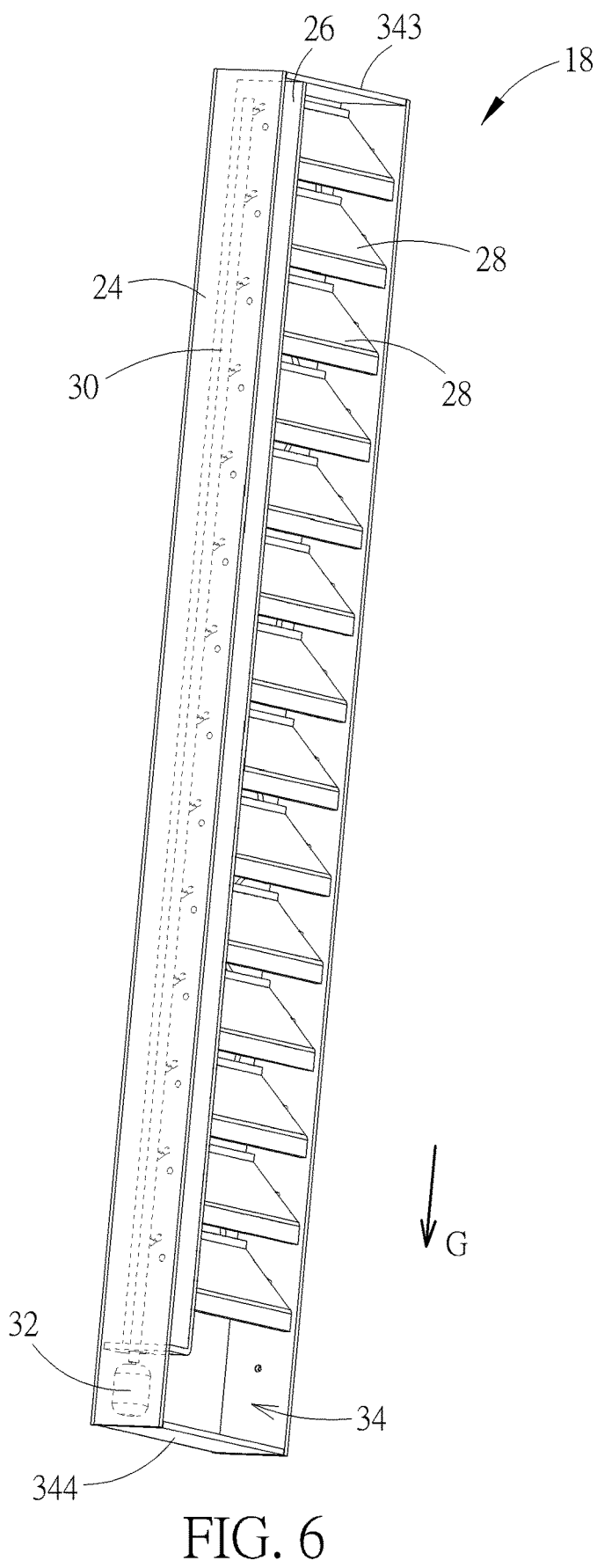
FIG. 6 is a diagram of a heat dissipation mechanism switched into a ventilation mode according to the first embodiment of the present application.
Figure 7:
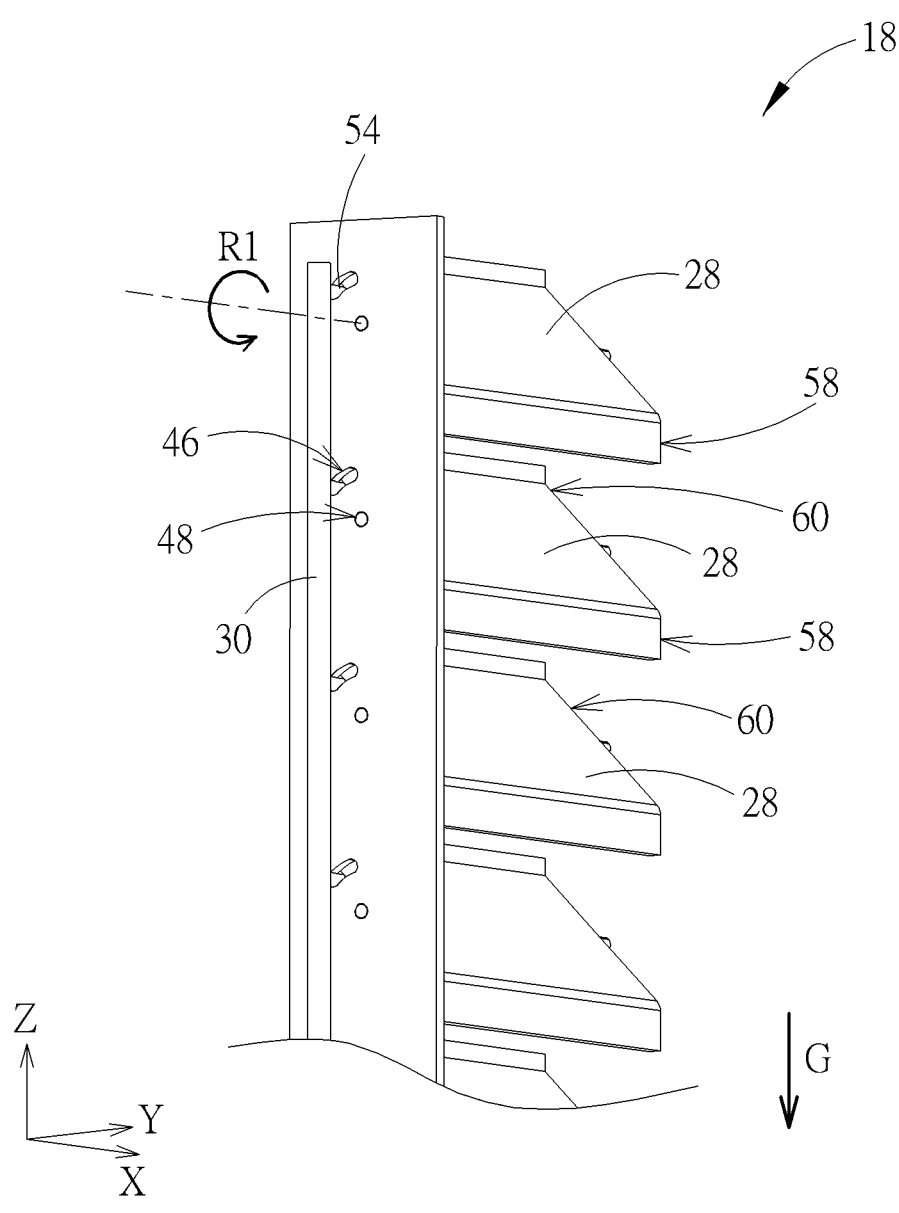
FIG. 7 is an enlarged diagram of a part of the heat dissipation mechanism switched into the ventilation mode according to the first embodiment of the present application.
Figure 8:
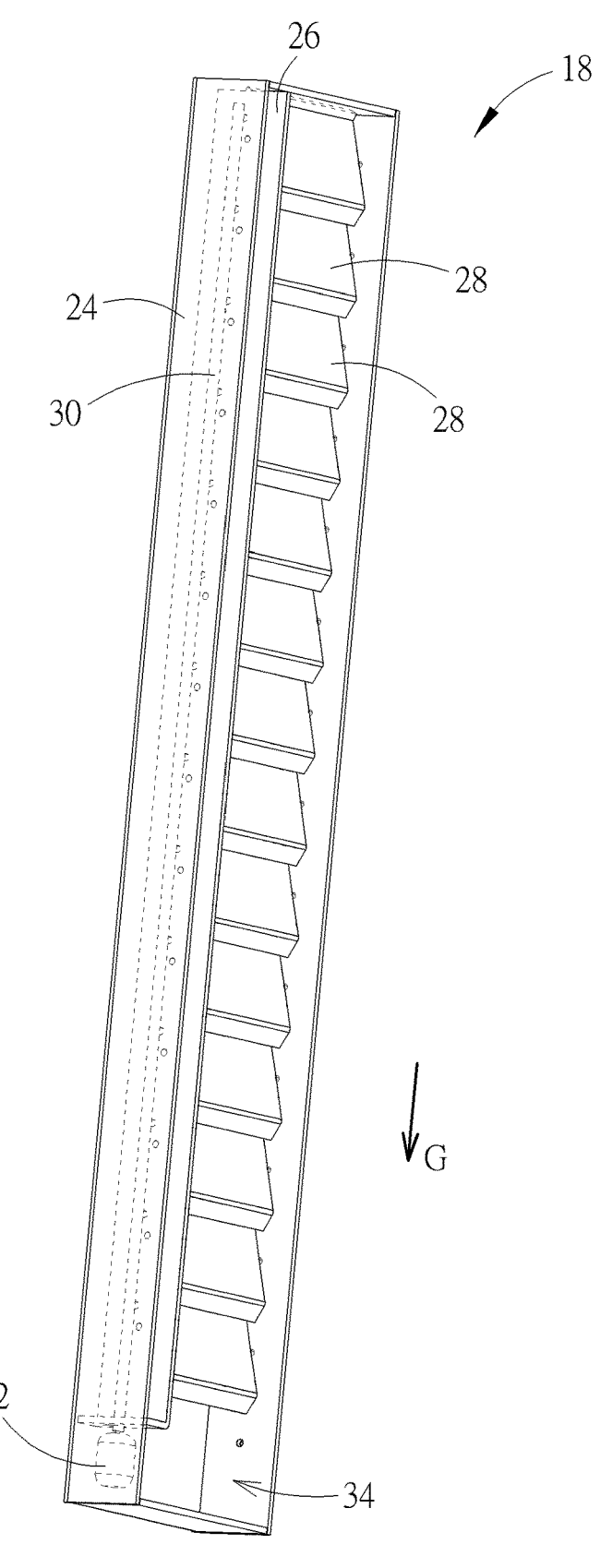
FIG. 8 is a diagram of the heat dissipation mechanism switched into a waterproof mode according to the first embodiment of the present application.
Figure 9:
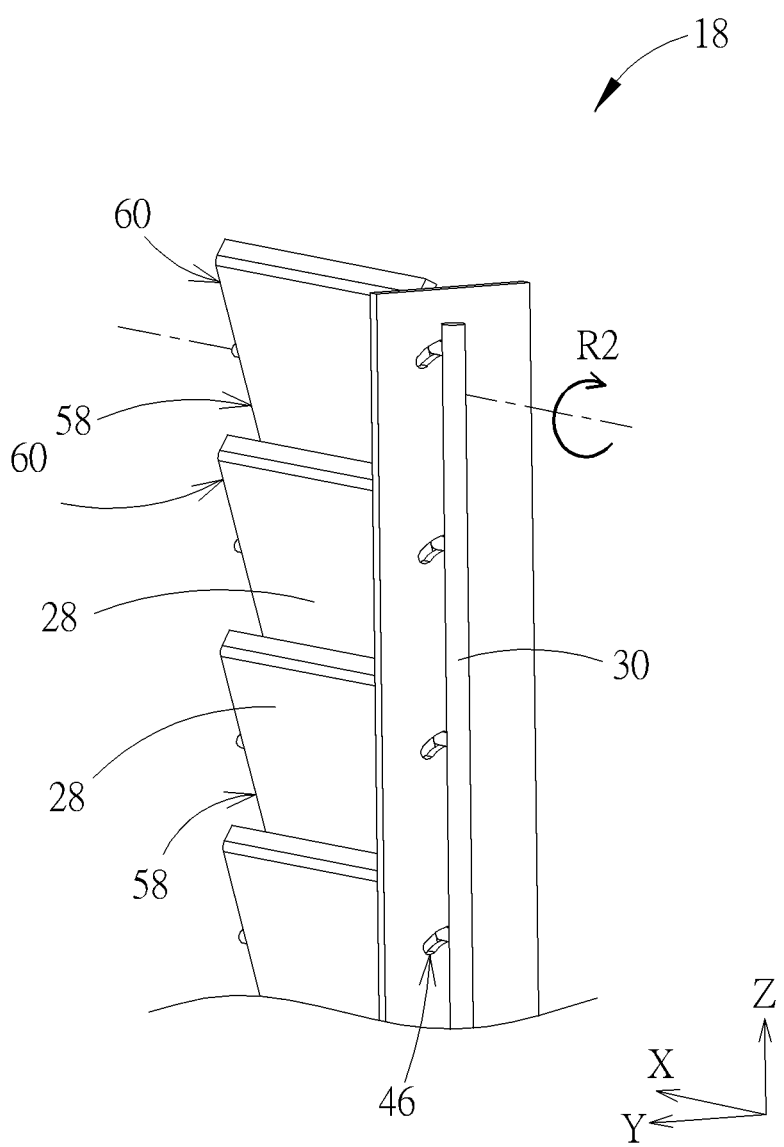
FIG. 9 is an enlarged diagram of a part of the heat dissipation mechanism switched into the waterproof mode according to the first embodiment of the present application.

Please refer to FIG. 4 to FIG. 9. FIG. 6 is a diagram of the heat dissipation mechanism 18 switched into a ventilation mode according to the first embodiment of the present application. FIG. 7 is an enlarged diagram of a part of the heat dissipation mechanism 18 switched into the ventilation mode according to the first embodiment of the present application. FIG. 8 is a diagram of the heat dissipation mechanism 18 switched into a waterproof mode according to the first embodiment of the present application. FIG. 9 is an enlarged diagram of a part of the heat dissipation mechanism 18 switched into the waterproof mode according to the first embodiment of the present application. The waterproof mode indicates that the heat dissipation mechanism 18 can effectively prevent the rainwater from flowing into the accommodating portion 20 of the case 12 thereby causing damage of the electronic component, and still have a heat dissipation function. The ventilation mode indicates that the heat dissipation mechanism 18 can provide the preferred heat dissipation function applied for sunny day or light rainy day.

As shown in FIG. 6 and FIG. 7, the heat dissipation mechanism 18 is in the ventilation mode, the slot body 34 has no water or a few water, and cannot provide sufficient buoyancy to the actuating module 32 (such as the float ball). The weight of the driving component 30 and the actuating module 32 (such as the float ball) can move the driving component 30 relative to the division component 26 and towards the slot bottom wall 344 of the slot body 34 in the direction of the gravity G, so that the driving component 30 can move the insertion pin 54 of the blade 28 inside the sliding slot 46 of the division component 26 and towards the slot bottom wall 344 (which means the embodiment shown in FIG. 7), and the blade 28 can be rotated relative to the slot top wall 343 based on the shaft 52 (or the blade 28 can be rotated in a first rotation direction R1 shown in FIG. 7, and the first rotation direction R1 can be, but not limited to, a counterclockwise direction). Therefore, the bottom region 58 of each blade 28 can be spaced from the top region 60 of the lower adjacent blade 28. Airflow generated by the fan 16 can pass through large space formed between the adjacent blades 28.

As shown in FIG. 8 and FIG. 9, the heat dissipation mechanism 18 is in the waterproof mode; if the environment where the electronic device 10 located is a rainy day, the rainwater dripping onto the blade 28 may flow into the slot body 34 and be accumulated inside the slot bottom wall 344 of the slot body 34. When liquid accumulated volume at the bottom of the slot body 34 conforms to a predefined condition, the actuating module 32 (such as the float ball) can be moved upwardly via the buoyancy in accordance with the foresaid liquid accumulated volume, and the driving component 30 can be driven to move relative to the division component 26 and towards the slot top wall 343. The predefined condition can depend on a size of the float ball. Therefore, the driving component 30 can move the insertion pin 54 of the blade 28 inside the sliding slot 46 of the division component 26 and towards the slot top wall 343 (which means the embodiment shown in FIG. 9). The blade 28 can be rotated relative to the slot bottom wall 344 based on the shaft 52 (or the blade 28 can be rotated in a second rotation direction R2 shown in FIG. 9, and the second rotation direction R2 can be, but not limited to, a clockwise direction). In the meantime, the bottom region 58 of each blade 28 can be moved close to the top region 60 of the lower adjacent blade 28. A gap between the adjacent blades 28 can be reduced, and the reduced gap can allow passing of the airflow generated by the fan 16 and further isolate the rainwater.

When the environment where the electronic device 10 is located stops raining, the liquid accumulated inside the slot bottom wall 344 of the slot body 34 can be drained out of the slot body 34 through the drain hole 62; when the liquid accumulated volume inside the slot body 34 is lower than the predefined condition, the buoyancy provided by the accumulated liquid can be smaller than the weight of the actuating module 32 (such as the float ball), and the weight of the driving component 30 and the actuating module 32 (such as the float ball) can move the driving component 30 relative to the division component 26 and towards the slot bottom wall 344 in the direction of the gravity G. The driving component 30 can rotate the blade 28 in the first rotation direction R1, and the blade 28 can be switched from the waterproof mode shown in FIG. 8 and FIG. 9 to the ventilation mode shown in FIG. 6 and FIG. 7.

Figure 10:
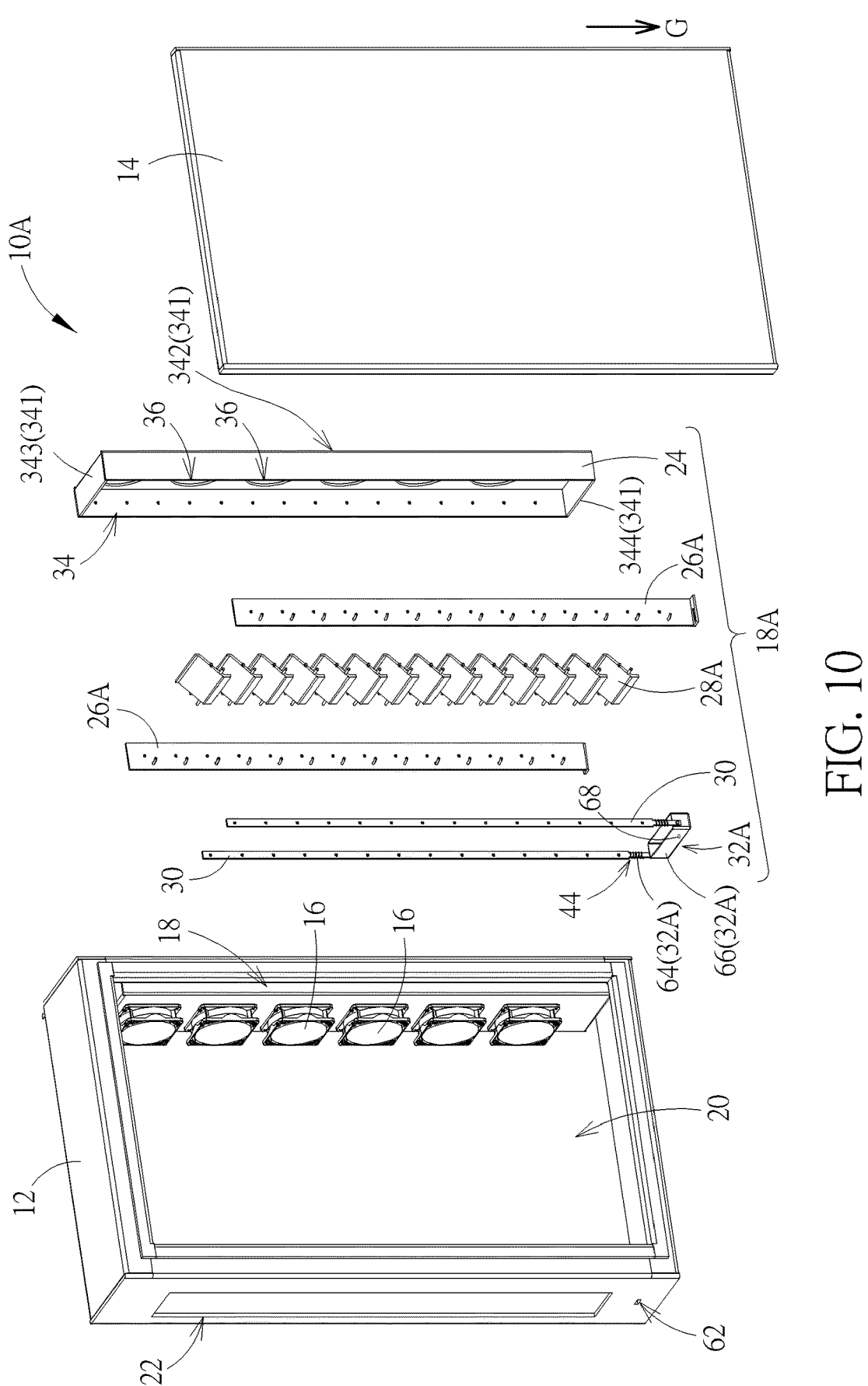
FIG. 10 is an exploded diagram of the electronic device according to a second embodiment of the present application.

Pleases refer to FIG. 10. FIG. 10 is an exploded diagram of the electronic device 10A according to a second embodiment of the present application. In the second embodiment, elements having the same numerals as ones of the first embodiment can have the same structures and functions, and the detailed description is omitted herein for simplicity. The heat dissipation mechanism 18A of the electronic device 10A can include the sheltering component 24, the division component 26A, the blade 28A, the driving component 30 and the actuating module 32A. The sheltering component 24 and the driving component 30 of the second embodiment can be the same as or different from the sheltering component 24 and the driving component 30 of the first embodiment, which depends on the design demand. The division component 26A and the driving component 30 can preferably be plural, and respectively disposed on two opposite sides of the sheltering component 24. The actuating module 32A can be disposed on the bottom end 44 of the driving component 30.

Figure 11:
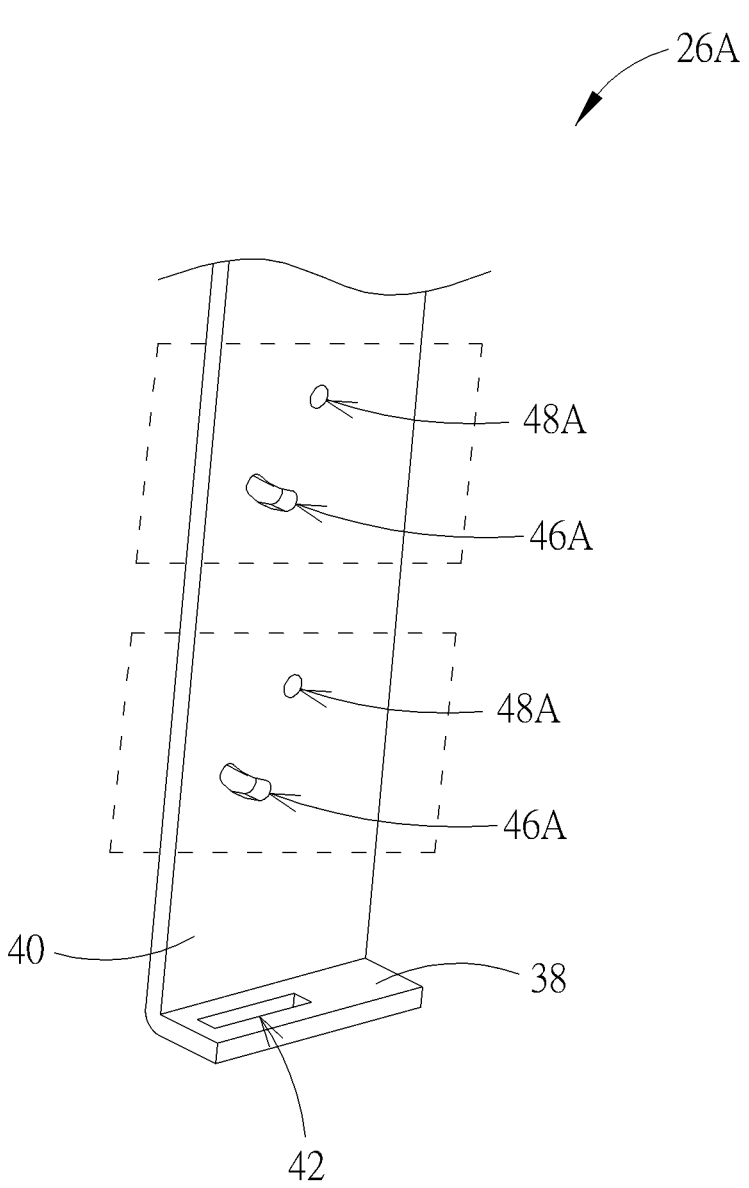
FIG. 11 is an enlarged diagram of a part of the division component according to the second embodiment of the present application.
Figure 12:
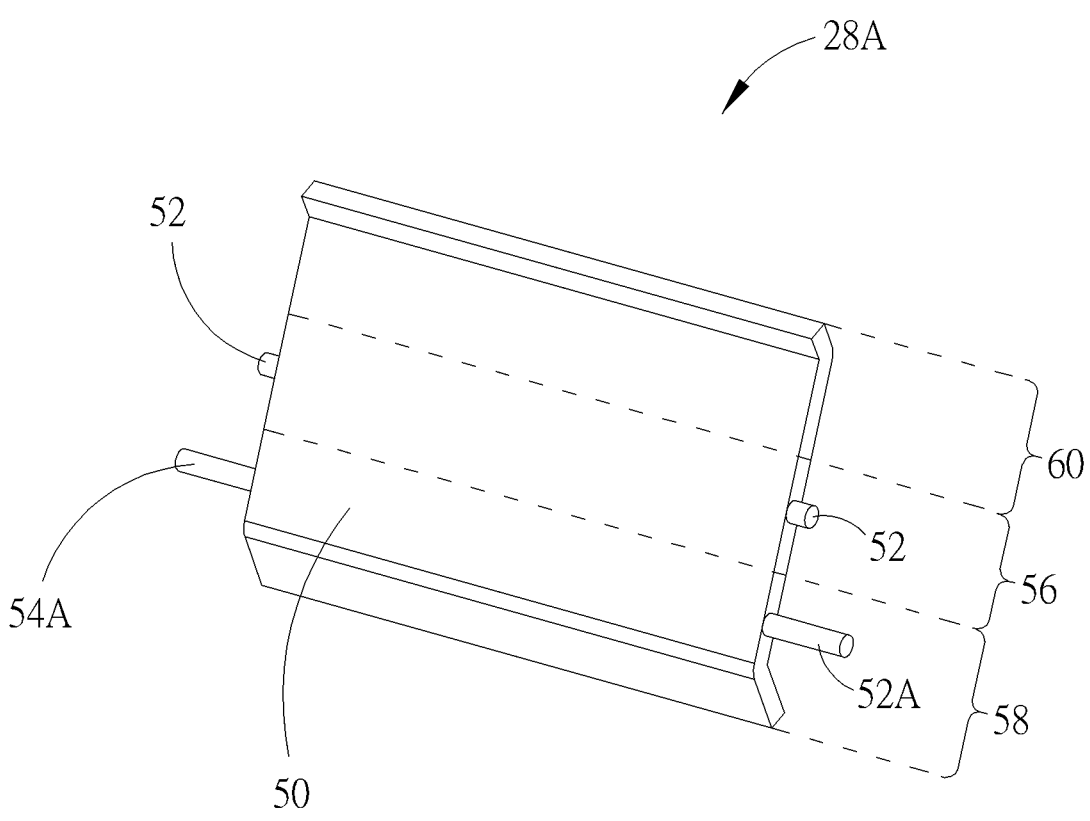
FIG. 12 is an enlarged diagram of a part of the blade according to the second embodiment of the present application.

Please refer to FIG. 10 to FIG. 12. FIG. 11 is an enlarged diagram of a part of the division component 26A according to the second embodiment of the present application. FIG. 12 is an enlarged diagram of a part of the blade 28A according to the second embodiment of the present application. The division component 26A can include the first section 38 and the second section 40 bent to each other. The angle can be formed between the first section 38 and the second section 40, and the division component 26A can be the L-shaped structure. The bottom end 44 of the driving component 30 can pass through the penetration hole 42 of the first section 38 to connect with the actuating module 32A. The second section 40 can include the plurality of sliding slots 46A and the plurality of pivot holes 48A. Each pivot assembly can have one sliding slot 46A and one pivot hole 48A. The sliding slot 46A of each pivot assembly can be located under the related pivot hole 48A. The blade 28A can include the main body 50, the shaft 52 and the insertion pin 54A. The insertion pin 54A of the blade 28A can be disposed on the bottom region 58 of the main body 50. The insertion pin 54A can pass through the sliding slot 46A of the division component 26A to connect with the driving component 30. The blade 28A can be rotated through the motion of the insertion pin 54A inside the sliding slot 46A, which means the insertion pin 54A can be moved inside the sliding slot 46A in accordance with the motion of the driving component 30, and the shaft 52 can be guided to rotate the blade 28A.

In the second embodiment, the actuating module 32A can include a resilient component 64 and a liquid storage element 66. The resilient component 64 can be, but not limited to, a compression spring. Two opposite ends of the resilient component 64 can respectively abut against the division component 26A and the driving component 30, and can store the resilient recovering force used to move the driving component 30 relative to the division component 26A and towards the slot top wall 343 in a direction opposite to the gravity G. The liquid storage element 66 can be disposed on the bottom end 44 of the driving component 30. A drain hole 68 can be formed on the bottom of the liquid storage element 66. The liquid storage element 66 can be used to accumulate the liquid. When the weight of the accumulated liquid is greater than the resilient recovering force of the resilient component 64, the liquid storage element 66 can move the driving component 30 towards the slot bottom wall 344 in the direction of the gravity G. The drain hole 68 of the liquid storage element 66 can drain the liquid accumulated inside the liquid storage element 66.

Figure 13:
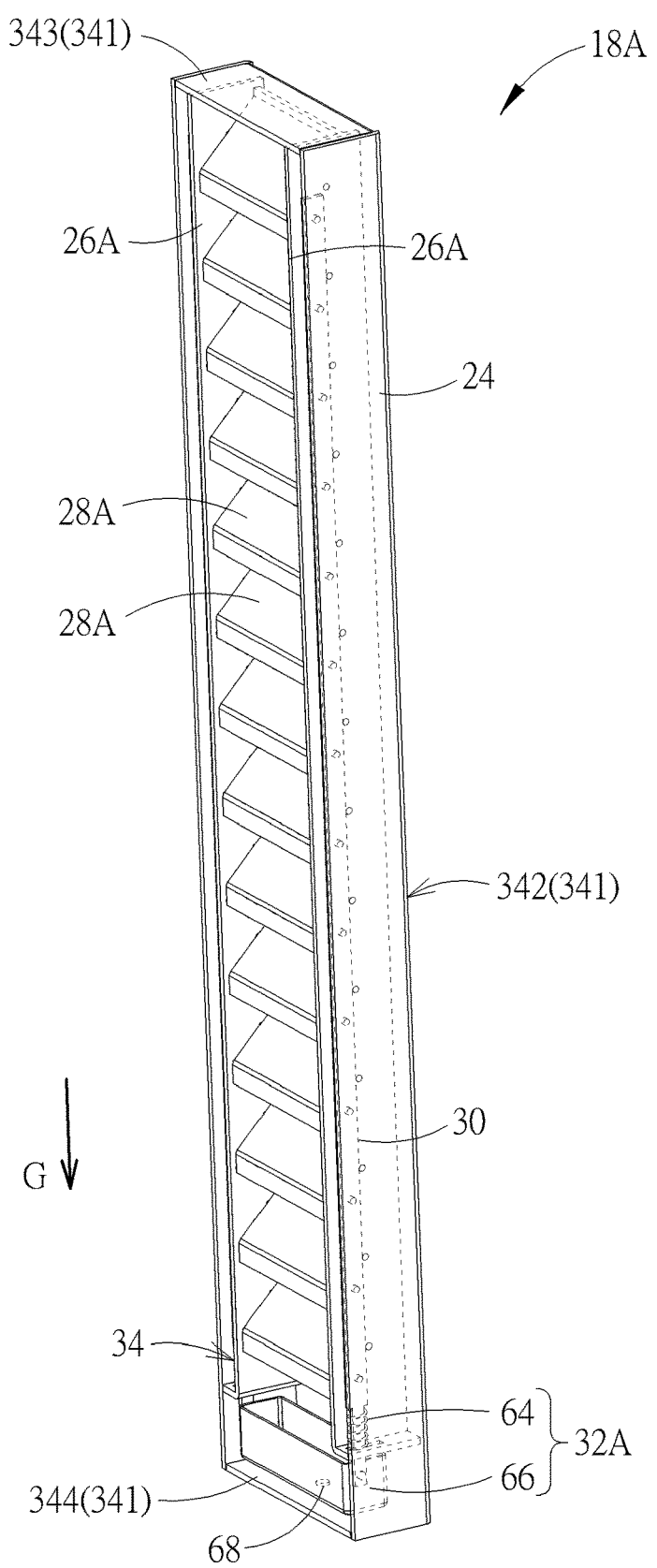
FIG. 13 is a diagram of the heat dissipation mechanism switched into the ventilation mode according to the second embodiment of the present application.
Figure 14:
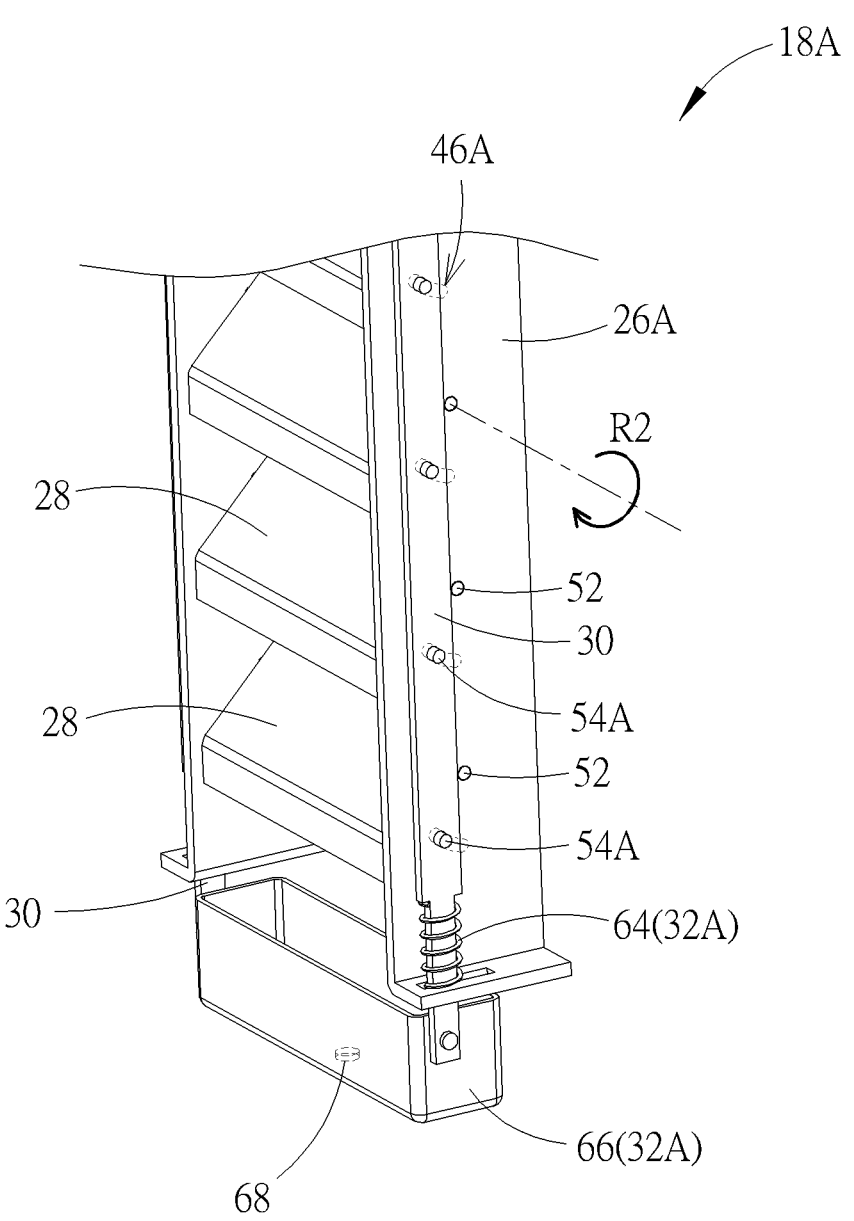
FIG. 14 is an enlarged diagram of a part of the heat dissipation mechanism switched into the ventilation mode according to the second embodiment of the present application.
Figure 15:
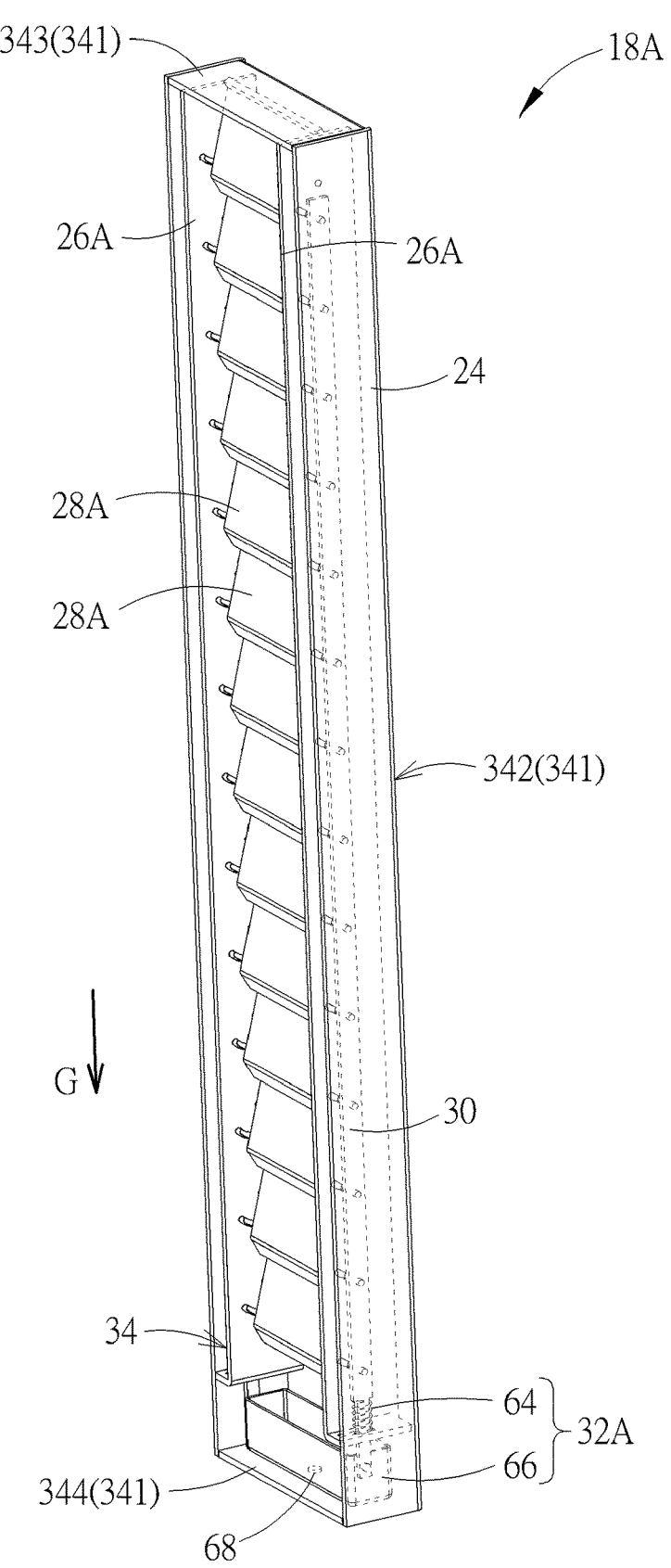
FIG. 15 is a diagram of the heat dissipation mechanism switched into the waterproof mode according to the second embodiment of the present application.
Figure 16:
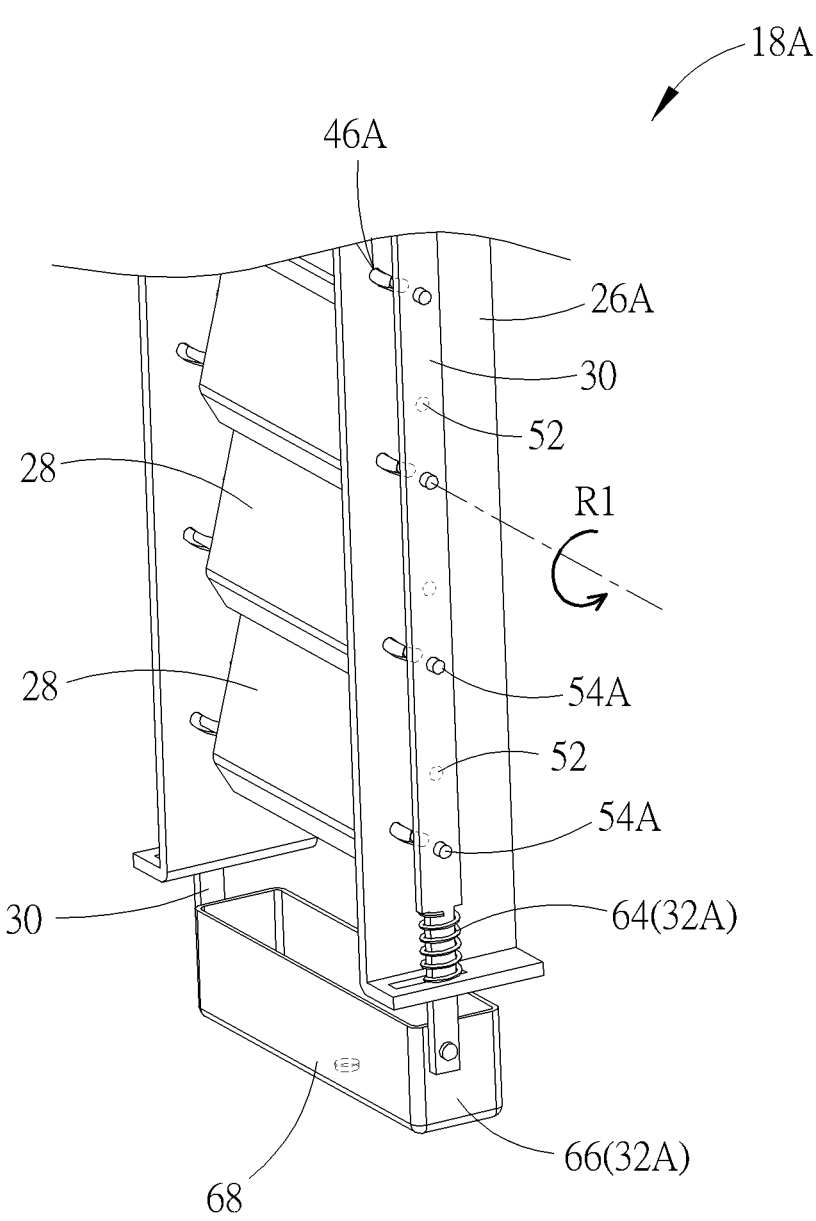
FIG. 16 is an enlarged diagram of a part of the heat dissipation mechanism switched into the waterproof mode according to the second embodiment of the present application.

Please refer to FIG. 11 to FIG. 16. FIG. 13 is a diagram of the heat dissipation mechanism 18A switched into the ventilation mode according to the second embodiment of the present application. FIG. 14 is an enlarged diagram of a part of the heat dissipation mechanism 18A switched into the ventilation mode according to the second embodiment of the present application. FIG. 15 is a diagram of the heat dissipation mechanism 18A switched into the waterproof mode according to the second embodiment of the present application. FIG. 16 is an enlarged diagram of a part of the heat dissipation mechanism 18A switched into the waterproof mode according to the second embodiment of the present application. The waterproof mode indicates that the heat dissipation mechanism 18A can effectively prevent the rainwater from flowing into the accommodating portion 20 of the case 12 thereby causing damage of the electronic component, and still have the heat dissipation function. The ventilation mode indicates that the heat dissipation mechanism 18A can provide the preferred heat dissipation function applied for sunny day or light rainy day.

As shown in FIG. 13 and FIG. 14, the heat dissipation mechanism 18A is in the ventilation mode, and the slot body 34 can have no water or less water, and does not affect the actuating module 32A. The resilient recovering force of the resilient component 64 of the actuating module 32A can push the driving component 30 to move relative to the division component 26A and towards the slot top wall 343 in the direction opposite to the gravity G, and the driving component 30 can move the insertion pin 54A inside the sliding slot 46A and towards the slot top wall 343 (which means the embodiment shown in FIG. 14). The blade 28A can be rotated relative to the slot top wall 343 based on the shaft 52 (or the blade 28A can be rotated in the second rotation direction R2 shown in FIG. 14). In the meantime, the bottom region 58 of each blade 28A can be spaced from the top region 60 of the lower adjacent blade 28A, and the airflow generated by the fan 16 can pass through large space between the adjacent blades 28A.

As shown in FIG. 15 and FIG. 16, the heat dissipation mechanism 18A is in the waterproof model; if the environment where the electronic device 10A located is a rainy day, the rainwater dripping onto the blade 28A can flow into the slot body 34 and be accumulated inside the liquid storage element 66 of the actuating module 32A. When the liquid accumulated volume inside the liquid storage element 66 conforms to the predefined condition, the weight provided by the liquid accumulated volume inside the liquid storage element 66 can move the driving component 30 relative to the division component 26A and towards the slot bottom wall 344 in the direction of the gravity G; the predefined condition can depend on a size of the liquid storage element 66. Therefore, the driving component 30 can move the insertion pin 54A inside the sliding slot 46A and towards the slot bottom wall 344 (which means the embodiment shown in FIG. 16). The blade 28A can be rotated relative to the slot bottom wall 344 based on the shaft 52 (or the blade 28A can be rotated in the first rotation direction R1 shown in FIG.

16). The bottom region 58 of each blade 28A can be moved close to the top region 60 of the lower adjacent blade 28A. The gap between the adjacent blades 28A can be reduced and the reduced gap can allow passing of the airflow generated by the fan 16 and further isolate the rainwater.

When the environment where the electronic device 10 located stops raining, the liquid accumulated inside the liquid storage element 66 can flow out of the liquid storage element 66 through the drain hole 68 to enter the slot body 34, and the liquid accumulated inside the slot body 34 can further flow out of the slot body 34 through the drain hole 62. When the liquid accumulated volume inside the liquid storage element 66 is lower than the predefined condition, the weight provided by the liquid accumulated volume can be smaller than the resilient recovering force of the resilient component 64, and the resilient component 64 can push the driving component 30 to move relative to the division component 26A and towards the slot top wall 343 in the direction opposite to the gravity G. The driving component 30 can rotate the blade 28A in the second rotation direction R2, and the blade 28A can be switched from the waterproof mode shown in FIG. 15 and FIG. 16 into the ventilation mode shown in FIG. 13 and FIG. 14.

In conclusion, the heat dissipation mechanism and the electronic device of the present application can rotate the blade to adjust the ventilation efficiency in response to the changes of weather. The heat dissipation mechanism of the first embodiment can set the float ball as the actuating module; the liquid can be accumulated inside the slot body in the rainy day, and the accumulated liquid can apply the buoyancy for the float ball, so the blade can be rotated to switch the heat dissipation mechanism into the waterproof mode by the actuating module and the driving component. When the rain stops, the liquid accumulated inside the slot body can be drained out of the slot body through the drain hole, the buoyancy of the float ball can be reduced, and the weight of the actuating module and the driving component can rotate the blade to switch the heat dissipation mechanism into the ventilation mode. The heat dissipation mechanism of the second embodiment can set the resilient component and the liquid storage element as the actuating module. In the rainy day, the weight of the accumulated liquid inside the liquid storage element can rotate the blade to switch the heat dissipation mechanism into the waterproof mode; when the rain stops, the accumulated liquid can flow out of the liquid storage element and the slot body, the resilient component can push and rotate the blade into the ventilation mode. Comparing to the prior art, the heat dissipation mechanism of the present application can utilize the buoyancy, the gravity and the resilient recovering force to drive rotation of the blades in response to the changes of weather, instead of utilizing any additional electronic control component to detect the weather and drive the rotation of the blades. The heat dissipation mechanism of the present application can have advantages of energy economy and simple structure, and is not easily damaged so as to avoid regular maintenance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A heat dissipation mechanism comprising:
a sheltering component;

a division component disposed on the sheltering component in a spaced manner;

a blade pivoted to the division component;

a driving component movably disposed on the division component and connected to the blade; and an actuating module connected to the driving component;

wherein, the blade and the driving component are respectively disposed on two opposite sides of the division component, and the blade is driven by the actuating module to rotate relative to the division component via the driving component.

2. The heat dissipation mechanism of claim 1, wherein the division component comprises a sliding slot, the blade comprises an insertion pin, the insertion pin of the blade passes through the sliding slot to connect with the driving component.

3. The heat dissipation mechanism of claim 2, wherein the sheltering component comprises a slot top wall and a slot bottom wall, the blade comprises a middle region, a bottom region and a top region, the bottom region and the top region are respectively connected to two opposite positions of the middle region, the blade is pivoted to the division component via the middle region, the top region is located adjacent to the slot top wall than the bottom region.

4. The heat dissipation mechanism of claim 3, wherein the actuating module comprises a floatable element disposed on a bottom end of the driving component, the floatable element has a hollow chamber, and the driving component is pushed by a buoyancy of the floatable element, so that the bottom region of the blade is rotated relative to the slot top wall.

5. The heat dissipation mechanism of claim 4, wherein the insertion pin is disposed on the top region of the blade.

6. The heat dissipation mechanism of claim 3, wherein the actuating module comprises a liquid storage element disposed on a bottom end of the driving component, the driving component is pulled by a weight of the liquid storage element, so that the bottom region of the blade is rotated relative to the slot bottom wall.

7. The heat dissipation mechanism of claim 6, wherein the actuating module further comprises a resilient component, two opposite ends of the resilient component respectively abut against the division component and the driving component, the driving component is pushed by a resilient recovering force of the resilient component, so that the bottom region of the blade is rotated relative to the slot top wall.

8. The heat dissipation mechanism of claim 7, wherein the insertion pin is disposed on the bottom region of the blade.

9. An electronic device comprising:

a case comprising a side plate; and a heat dissipation mechanism comprising:

a sheltering component connected to the side plate;

a division component disposed on the sheltering component in a spaced manner;

a blade pivoted to the division component;

a driving component movably disposed on the division component and connected to the blade; and an actuating module connected to the driving component;

wherein, the blade and the driving component are respectively disposed on two opposite sides of the division component, and the blade is driven by the actuating module to rotate relative to the division component via the driving component.

10. The electronic device of claim 9, wherein the electronic device further comprises a fan disposed inside the case and adjacent to the heat dissipation mechanism; a first heat dissipation hole is formed on the side plate of the case; the sheltering component comprises an slot inner wall, a second heat dissipation hole is formed on the slot inner wall; the fan faces the second heat dissipation hole, and the second heat dissipation hole is communicated with the first heat dissipation hole.

11. The electronic device of claim 9, wherein the division component comprises a sliding slot, the blade comprises an insertion pin, the insertion pin of the blade passes through the sliding slot to connect with the driving component.

12. The electronic device of claim 11, wherein the sheltering component comprises a slot top wall and a slot bottom wall, the blade comprises a middle region, a bottom region and a top region, the bottom region and the top region are respectively connected to two opposite positions of the middle region, the blade is pivoted to the division component via the middle region, the top region is located adjacent to the slot top wall than the bottom region.

13. The electronic device of claim 12, wherein the actuating module comprises a floatable element disposed on a bottom end of the driving component, the floatable element has a hollow chamber, the driving component is pushed by a buoyancy of the floatable element, so that the bottom region of the blade is rotated relative to the slot top wall.

14. The electronic device of claim 13, wherein the insertion pin is disposed on the top region of the blade.

15. The electronic device of claim 12, wherein the actuating module comprises a liquid storage element disposed on a bottom end of the driving component, the driving component is pulled by a weight of the liquid storage element, so that the bottom region of the blade is rotated relative to the slot bottom wall.

16. The electronic device of claim 15, wherein the actuating module further comprises a resilient component, two opposite ends of the resilient component respectively abut against the division component and the driving component, the driving component is pushed by a resilient recovering force of the resilient component, so that the bottom region of the blade is rotated relative to the slot top wall.

17. The electronic device of claim 15, wherein the insertion pin is disposed on the bottom region of the blade.

18. The electronic device of claim 10, wherein the sheltering component further comprises a slot bottom wall, a first distance between a bottom edge of the first heat dissipation hole and the slot bottom wall is smaller than a second distance between a bottom edge of the second heat dissipation hole and the slot bottom wall.

19. The electronic device of claim 18, wherein the case further comprises a drain hole, a third distance between a bottom edge of the drain hole and the slot bottom wall is smaller than the first distance between the bottom edge of the first heat dissipation hole and the slot bottom wall.

20. An electronic device comprising:

a case comprising a side plate, a first heat dissipation hole being formed on the side plate;

a fan disposed inside the case; and a heat dissipation mechanism comprising:

a sheltering component connected to the side plate to form a slot body, the slot body comprising an slot inner wall, and a second heat dissipation hole being formed on the slot inner wall;

a division component disposed inside the slot body of the sheltering component;

a blade pivoted to the division component;

a driving component movably disposed on the division component and connected to the blade; and

an actuating module connected to the driving compo-
nent;
wherein the fan faces the second heat dissipation hole, and
the second heat dissipation hole faces the first heat
dissipation hole, the blade is disposed between the first
heat dissipation hole and the second heat dissipation
hole, the blade is driven by the actuating module to
rotate relative to the first heat dissipation hole and the
second heat dissipation hole via the driving component.

* * * * *